United States Patent
Sheu et al.

[11] Patent Number: 5,994,185
[45] Date of Patent: Nov. 30, 1999

[54] METHOD OF FABRICATING FLASH MEMORY CELL

[75] Inventors: Yau-Kae Sheu; Gary Hong, both of Hsinchu, Taiwan

[73] Assignee: United Semiconductor Corp., Hsinchu, Taiwan

[21] Appl. No.: 09/024,163

[22] Filed: Feb. 17, 1998

[30] Foreign Application Priority Data

Feb. 7, 1998 [TW] Taiwan .................................. 87101623

[51] Int. Cl.$^6$ ............................................... H01L 21/336
[52] U.S. Cl. .......................................... 438/257; 438/286
[58] Field of Search .................................. 148/DIG. 174; 257/321, 329, 357, 530; 438/238, 286, 305, 270, 257, 128

[56] References Cited

U.S. PATENT DOCUMENTS

| | | | |
|---|---|---|---|
| 3,934,159 | 1/1976 | Nomiya et al. ................ | 148/DIG. 174 |
| 5,065,212 | 11/1991 | Ohata et al. ................... | 148/DIG. 174 |
| 5,138,415 | 8/1992 | Yano ............................... | 148/DIG. 174 |
| 5,178,370 | 1/1993 | Clark et al. .................... | 257/212 |
| 5,270,230 | 12/1993 | Sakurai ........................... | 438/257 |
| 5,273,917 | 12/1993 | Sakurai ........................... | 438/257 |
| 5,547,880 | 8/1996 | Williams et al. ............... | 438/206 |
| 5,591,652 | 1/1997 | Matsushita ..................... | 438/259 |
| 5,804,470 | 9/1998 | Wollesen ........................ | 438/141 |

Primary Examiner—John F. Niebling
Assistant Examiner—Walter L. Lindsay Jr.
Attorney, Agent, or Firm—Merchant & Gould P.C.

[57] ABSTRACT

A method of fabricating a flash memory. A heavily doped region with the opposite polarity of the drain region is formed between the channel region and the drain region. The heavily doped region is in a bar shape extending towards both the drain and the source regions along a side of the floating gate. Furthermore, the reading operation is performed in reverse by applying a zero voltage to the drain region, and a non-zero voltage to the source region.

7 Claims, 5 Drawing Sheets

5,994,185

METHOD OF FABRICATING FLASH MEMORY CELL

CROSS-REFERENCE TO RELATED APPLICATION

This application claims the priority benefit of Taiwan application serial no. 87101623, filed Feb. 7, 1998, the fill disclosure of which is incorporated herein by reference.

BACKGROUND OF THE INVENTION

1. Field of the Invention

The invention relates to a method of fabricating a flash memory cell, and more particularly to a method of fabricating Zener breakdown based flash memory.

2. Description of the Related Art

The conventional flash memory is an electrically erasable and programmable read only memory ($E^2PROM$), which is a non-volatile memory. Normally, a conventional flash memory comprises two gates. One is a floating gate formed of poly-silicon for the purpose of data storage, the other is a control gate for controlling data access. The floating gate is formed under the control gate without direct connecting to the control gate. The characteristic of the flash memory is to erase data block by block. Compared to the conventional $E^2PROM$ which erases data bit by bit, the data erase is completed in a much shorter time, for example, from a few minutes to one to two seconds. The operation speed of flash memory is thus much faster than the operation speed of the conventional $E^2PROM$.

Referring to FIG. 1, on a first type semiconductor substrate 10, a floating gate 18 is formed. Two second type doped regions are formed in the substrate 10 in each side of the floating gate 18. These two second type doped regions include a source region 12 and a drain region 14. On the floating gate 18, a control gate 16 is formed with a bar shape extending on the substrate 10.

As the dimension of devices reduces, it is more and more difficult to fabricate a flash memory with a high programming speed. The process of fabricating a flash memory with a high programming current and a high programming speed is under development.

SUMMARY OF THE INVENTION

It is therefore an object of the invention to provide a method of fabricating a flash memory. A Zener diode is formed between the gate and the drain region to obtain a lower breakdown voltage in a flash memory. With a relative low operation voltage, the flash memory is programmed.

To achieve these objects and advantages, and in accordance with the purpose of the invention, as embodied and broadly described herein, the invention is directed towards a method of fabricating a flash memory cell. On a substrate doped with a first type dopnat, an insulation layer is formed. A photo-resist layer is formed and patterned on the insulation layer, so that a part of the substrate and the insulation layer are exposed. The exposed substrate is doped to form a first type heavily doped region. The photo-resist layer is removed. A field oxide layer is formed on the exposed substrate by thermal oxidation, and simultaneously, the first type heavily doped region is thermally diffused. The insulation layer is removed. A first conductive layer is formed and patterned on the substrate. A dielectric layer and a second conductive layer are formed on the first conductive layer in sequence. The first conductive gate, the dielectric layer and the second conductive layer are patterned to form a gate. After doping the substrate, a second type drain region and a second type source region are formed by using the gate as a mask.

It is to be understood that both the foregoing general description and the following detailed description are exemplary and explanatory only and are not restrictive of the invention, as claimed.

BRIEF DESCRIPTION OF THE DRAWINGS

Other objects, features, and advantages of the invention will become apparent from the following detailed description of the preferred but non-limiting embodiments. The description is made with reference to the accompanying drawings in which:

FIG. 3A to FIG. 5A show the top view of the process of fabricating a flash memory in a preferred embodiment according to the invention; and FIG. 3B to FIG. 5B are the cross sectional view along Y—Y' direction.

DESCRIPTION OF THE PREFERRED EMBODIMENTS

In a conventional $E^2PROM$, hot electrons are created in the channel region for programming. As the process of semiconductor fabrication becomes more and more advanced, the dimension of devices becomes smaller and smaller. In the fabrication regime under 0.5 $\mu$m, the operation voltage of the drain region is reduced in order to avoid punchthrough breakdown effect in the channel region. However, the electric field created in the drain region is restricted due to the reduction of operation voltage, and therefore, the hot electron generation efficiency is degraded. In the invention, an additional heavily doped region is formed between the drain region and the gate region. The polarity of the heavily doped region is opposite to the polarity of the drain region. Thus, a $P^+N^+$ junction is formed between the channel and the drain region. By applying a relatively low voltage, a Zener breakdown occurs, and more hot electrons are created for programming.

In the invention, a flash memory with an improved structure and the fabrication method of the same is disclosed. A $P^+N^+$ junction is formed between the channel region and the drain region. A Zener breakdown is easily to occur with a relatively low voltage in the $P^+N^+$ junction compared to operation voltage required by a conventional flash memory for programming. A fast programming is thus achieved. On the other hand, the low breakdown voltage of the Zener diode induces much more trapping in the tunnel oxide if reading operation is performed from drain side. In the invention, the reading operation is reversed to the source, and therefore, the read disturb is reduced. Consequently, the degradation of devices is avoided.

Figure 1:
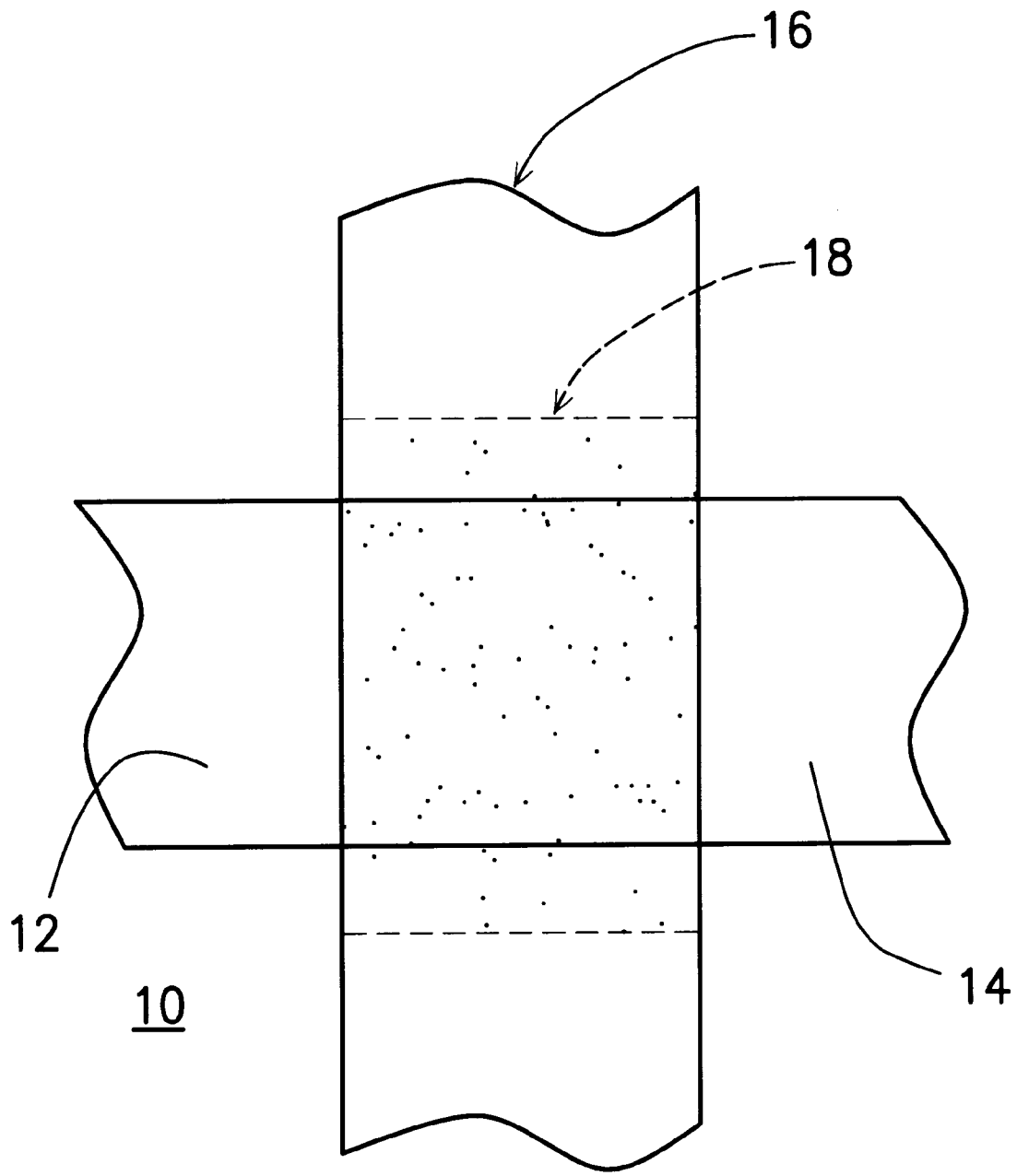
FIG. 1 shows the top view of a conventional flash memory.
Figure 2A:
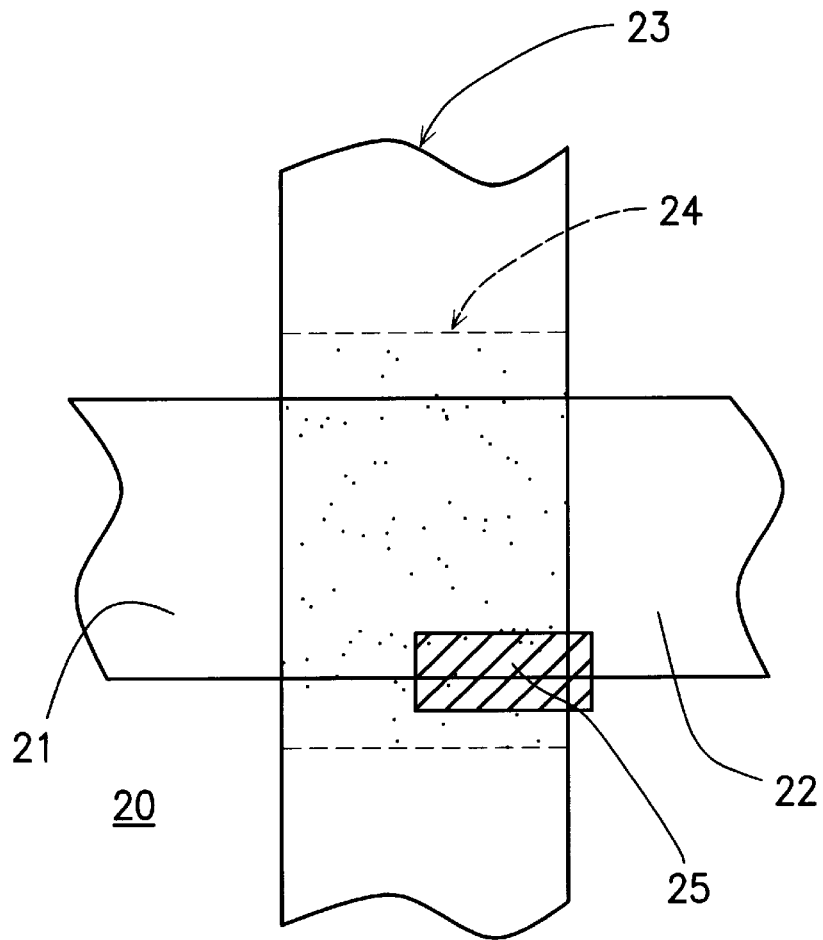
FIG. 2A shows the top view of a flash memory in a preferred embodiment according to the invention.

Referring to FIG. 2A, a floating gate 24 is formed on a first type substrate 20, for example, a P-type semiconductor substrate. Two second type doped regions, that is, an N-type source region 21 and an N-type doped drain region 22 are formed in the substrate 20 by each side of the floating gate 24. Under the floating gate 24, a first type heavily doped region, for example, a $P^+$ heavily doped region is formed.

The second type doped region is formed with the length extending towards both the source region 21 and drain region 22 along a side of the floating gate 24. A control gate 23 is formed over the floating gate 24 without electrical connection.

Figure 2B:
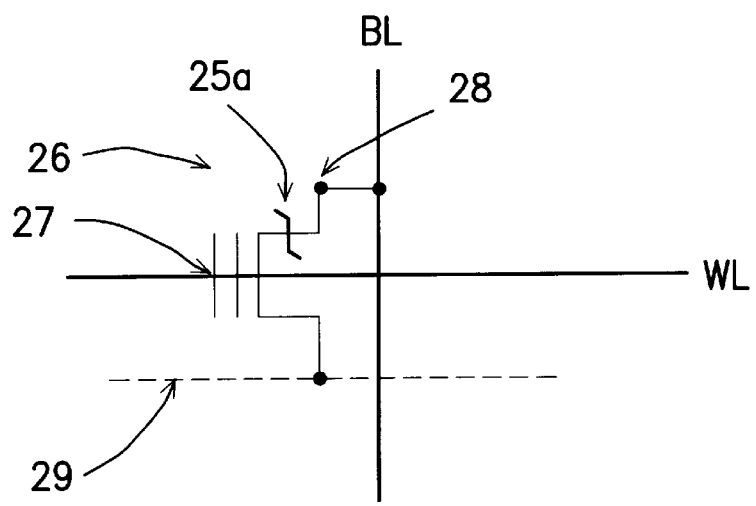
FIG. 2B is the circuit diagram of the flash memory shown as FIG. 2A.

Referring to FIG. 2B, in the memory cell 26 fabricated according to the invention, the gate 27 is coupled with the word line WL. The drain region 28 is coupled with the bit line BL, and the source region 29 is shared by memory cell 26 and other memory cells as a source line. Between the gate 27 and the drain region, a $P^+N^+$ junction, that is, a Zener diode 25a is formed.

Figure 3B:
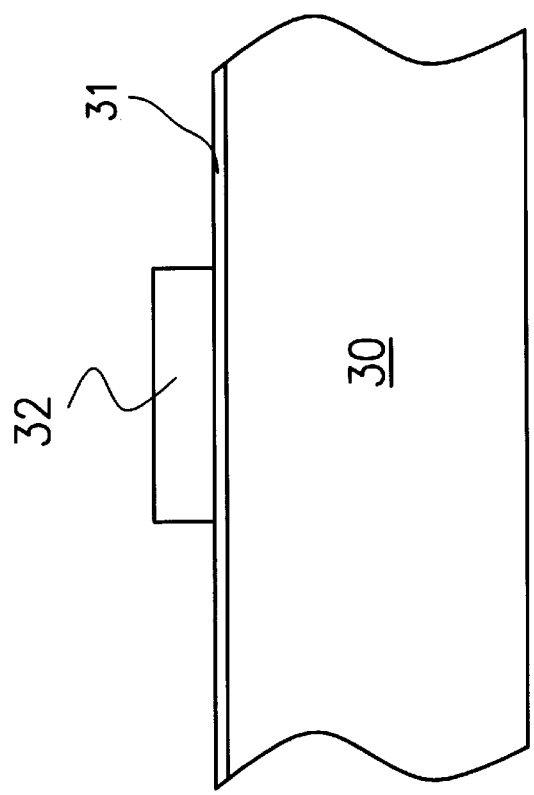
Figure 3A:
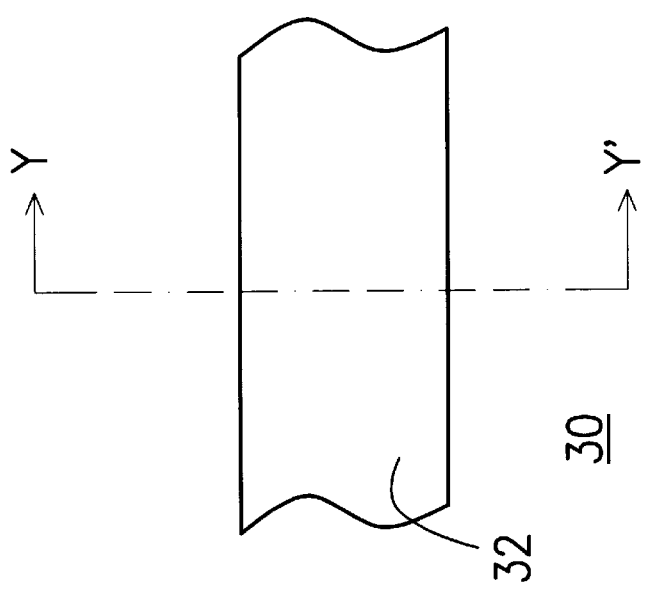

Referring to FIG. 3A and FIG. 3B, on a semiconductor substrate 30 such as a lightly doped P-type semiconductor substrate, a pad oxide layer 31 is formed, for example, by thermal oxidation. An insulation layer 32, for example, a silicon nitride layer is formed on the pad oxide layer.

Figure 4B:
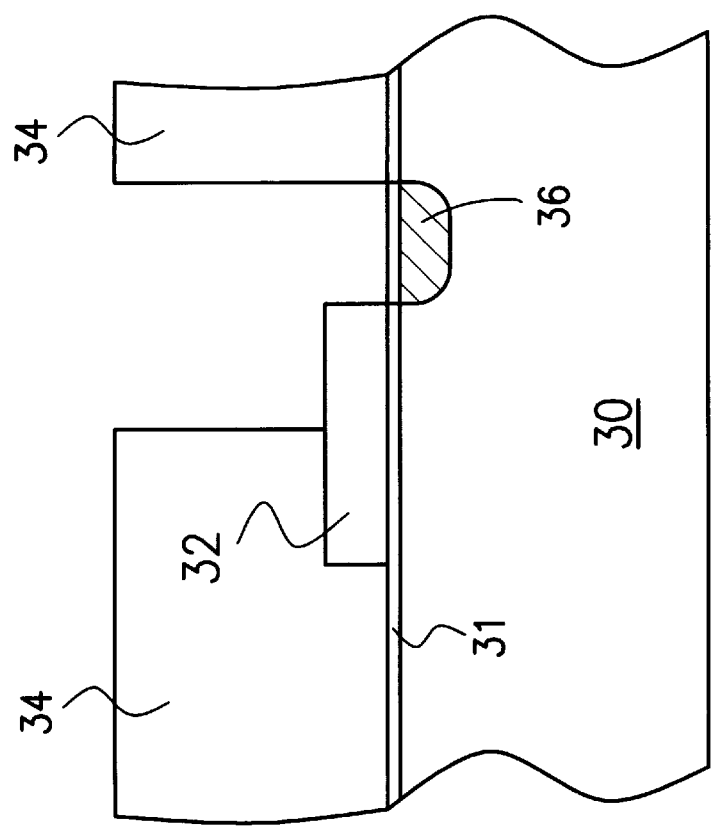
Figure 4A:
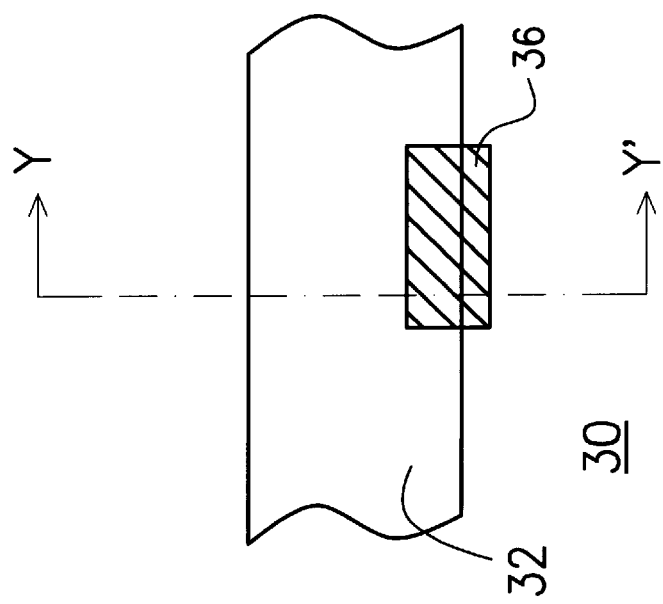

Referring to FIG. 4A and FIG. 4B, using photolithography, a photo-resist layer 34 is formed and patterned on the insulation layer 32. Using the photo-resist layer 34 as a mask, an ion implantation is performed to form a heavily doped region 36 in the substrate 30. The photo-resist layer 34 is removed.

Figure 5B:
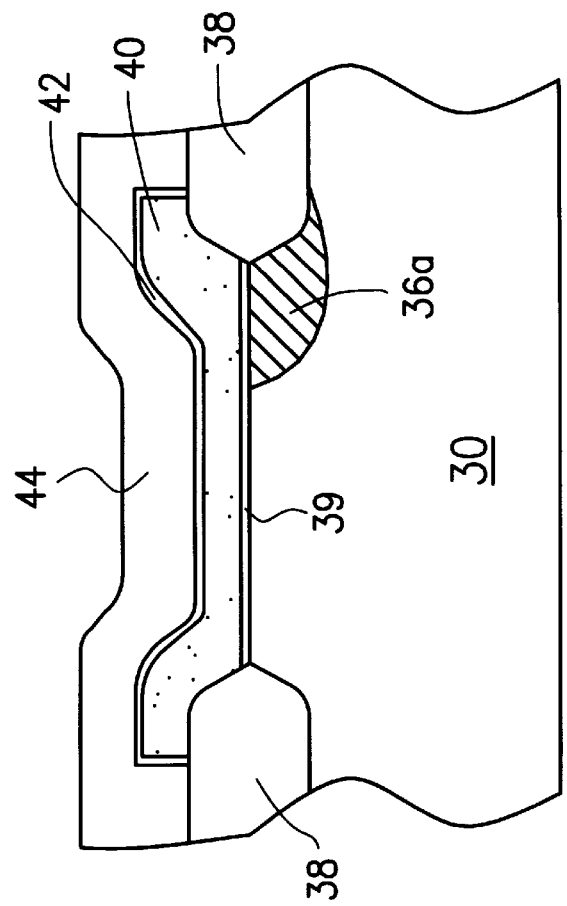
Figure 5A:
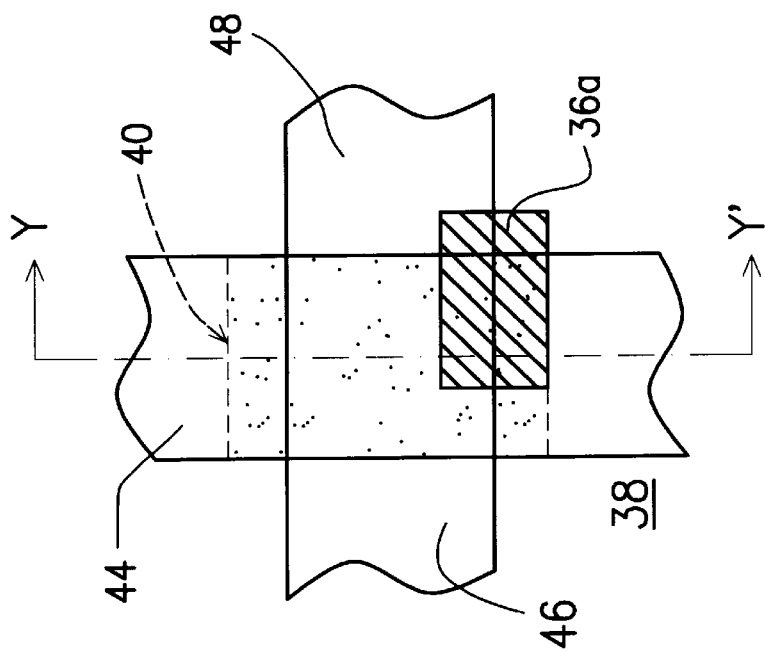

Referring to FIG. 5A and FIG. 5B, using thermal oxidation, a field oxide layer 38 is formed on the substrate 30 for device isolation, and therefore, an active region is formed. During thermal oxidation, the first type heavily doped region 36 is thermally diffused to form a larger first type doped region 36a. The pad oxide layer 31 and the insulation layer 32 are removed. A gate oxide layer 39 having a thickness of about, for example, 100 Å to 250 Å, is formed on the active region. A first conductive layer 40, preferably a doped poly-silicon layer having a thickness of about 1000 Å to 2000 Å, is formed on the gate oxide layer 39. The first conductive layer 40 is patterned to formed a floating gate 40. A dielectric layer 42 and a second conductive layer 44, preferably a doped poly-silicon layer having a thickness of about 1500 Å to 3000 Å, are formed on the gate oxide layer 40 in sequence. The dielectric layer 42 includes, for example, an oxide/nitride/oxide layer (ONO). The first conductive layer 40, the dielectric layer 42 and the second conductive layer 44 are etched. As a result, a control gate 44 in a bar shape is formed of the second conductive layer 44 as shown in FIG. 5A. Using the control gate 44 as a mask, a second type dopant is implanted to the substrate 30 to form a second type heavily doped source region 46 and a second type heavily doped drain region 48, for example, an N-type source region 46 and an N-type drain region. The implanted dopant includes, for example, arsenic ions with a concentration of about $1E15/cm^2$ to $5E15/cm^2$ at a doping energy of about 50 KeV to 80 KeV. The top view of the first type heavily doped region 36a is a bar shape extending towards both the source region 46 and the drain region 48 along a side of the floating gate 40.

Referring to Table 1, operation condition of the flash memory fabricated according to the invention is shown.

In Table 1, during programming, due to the formation of the Zener diode between the drain region and the channel, a lower voltage is required to induce a breakdown current. For example, by applying a voltage of 5 V, hot electrons are created by Zener breakdown. A larger current is created, and the programming speed is enhanced. During reading operation, on the contrary of the conventional method, the drain region kept with a voltage of 0 V, and a voltage of 5 V is applied to the source region. It is known that the low breakdown voltage of the Zener diode induces much more trapping in the tunnel oxide if reading operation is performed from drain side. In the invention, the reading operation is reversed to the source, and therefore, the read disturb is reduced. Consequently, the degradation of devices is avoided. During erase, the control gate is supplied with a voltage of −12 V, and the source region is supplied with a voltage of 3.5 V.

The advantages of the invention are:

(1) With the formation of a Zener diode between the drain region and the channel, during programming, a Zener breakdown occurs. Since the Zener breakdown voltage is lower than the operation voltage of the conventional flash memory, in addition to the low voltage application, the flash memory fabricated according to the invention is favourable for high speed and high integrated circuits.

(2) During reading operation, on the contrary of the conventional method, the drain region kept with a voltage of 0 V, and a voltage of 5 V is applied to the source region. It is known that the low breakdown voltage of the Zener diode induces much more trapping in the tunnel oxide if reading operation is performed from drain side. In the invention, the reading operation is reversed to the source, and therefore, the read disturb is reduced. Consequently, the degradation of devices is avoided.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a flash memory cell, wherein a substrate doped with a first type dopant is provided, comprising:

forming an insulation layer on the substrate;

forming and patterning a photo-resist layer on the insulation layer, so that a part of the substrate and the insulation layer are exposed;

doping the exposed substrate to form a first type heavily doped region, and removing the photo-resist layer;

forming a field oxide layer on the exposed substrate by thermal oxidation, and simultaneously, expanding the first type heavily doped region;

removing the insulation layer;

TABLE 1

| Operation | Gate Voltage | Drain Voltage | Source Voltage | Substrate Voltage |
|---|---|---|---|---|
| Programming | 12V | 5V | 0V | 0V |
| Read | 5V | 0V | 1.5V | 0V |
| Erase | −12V | X | 3.5V | 0V | forming and patterning a first conductive layer on the substrate;

forming a dielectric layer and a second conductive layer on the first conductive layer in sequence;

patterning the first conductive gate, the dielectric layer and the second conductive layer to form a gate; and doping the substrate to form a second type drain region and a second type source region by using the gate as a mask.

2. The method according to claim 1, wherein the insulation layer includes a silicon nitride layer.

3. The method according to claim 1, wherein a gate oxide is formed between the substrate and first conductive layer.

4. The method according to claim 1, wherein the first conductive layer includes a doped poly-silicon layer.

5. The method according to claim 1, wherein the second conductive layer includes a doped poly-silicon layer.

6. The method according to claim 1, wherein the gate comprises a floating gate formed of the first conductive layer, a dielectric layer, and a control gate formed of the second conductive layer.

7. The method according to claim 1, wherein the first type heavily doped region is in a bar shape extending towards both the source region and the source region along a side of the floating gate.

* * * * *